(12) United States Patent
Nishino et al.

(10) Patent No.: US 6,731,118 B2
(45) Date of Patent: May 4, 2004

(54) CONNECTOR INSPECTION APPARATUS

(75) Inventors: Akira Nishino, Yokkaichi (JP); Takao Fujita, Yokkaichi (JP)

(73) Assignee: Sumitomo Wiring System Ltd., Yokkaichi (JP)

( * ) Notice: Subject to any disclaimer, the term of this patent is extended or adjusted under 35 U.S.C. 154(b) by 23 days.

(21) Appl. No.: 10/158,120

(22) Filed: May 31, 2002

(65) Prior Publication Data

US 2002/0186021 A1 Dec. 12, 2002

(30) Foreign Application Priority Data

Jun. 7, 2001 (JP) ........................................ 2001-172104
Jun. 15, 2001 (JP) ........................................ 2001-181160

(51) Int. Cl.[7] ............................ H01H 31/04; H01R 3/00
(52) U.S. Cl. ........................................ 324/538; 439/488
(58) Field of Search ................................ 524/538, 754, 524/756–758, 72.5; 439/310, 345, 347, 752, 488, 489

(56) References Cited

U.S. PATENT DOCUMENTS 5,455,515 A * 10/1995 Saijo et al. .................. 324/538
5,467,023 A * 11/1995 Takeyama .................... 324/754
6,316,951 B1   11/2001 Chiyoda

FOREIGN PATENT DOCUMENTS

JP  9-82444    3/1997
JP  112333186  8/1999

OTHER PUBLICATIONS

English Language Abstract of JP 9-82444.
English Langauge Abstract of JP 11-233186.

* cited by examiner

Primary Examiner—N. Le
(74) Attorney, Agent, or Firm—Greenblum & Bernstein, P.L.C.

(57) ABSTRACT

A connector inspection apparatus is provided for inspection of a connector having a terminal receiving portion provided with cavities in which terminals are inserted, and a retainer attached to the terminal receiving portion. The connector inspection apparatus includes a holder for holding the connector during inspection, an inspection unit, and a lever for moving the inspection unit forward and rearward with respect to the holder. When the inspection unit is moved forwardly by the lever, a retainer position inspection piece provided in the inspection unit assumes either a forward movable condition or a rearward movable condition dependent upon whether the retainer is in a proper locked condition within the connector. When the retainer position inspection piece is in the backward movable condition, an electrical detection device detects the condition of the retainer. A continuity test pin contacts a terminal within the connector to effect a continuity test when the inspection unit is moved forwardly by the lever.

14 Claims, 13 Drawing Sheets

CONNECTOR INSPECTION APPARATUS

BACKGROUND OF THE INVENTION

1. Field of the Invention

The present invention relates to a connector inspection apparatus, and more particularly relates to an apparatus for inspecting a connector in which a terminal is inserted in a terminal receiving portion of a connector housing, a retainer is attached to the connector housing to prevent removal of the terminal from the housing, and in which a portion of the retainer projects outwardly if the retainer is in a condition of only partial engagement with the terminal. Such retainers lock a terminal inserted in a connector housing when in full engagement therewith.

2. Description of the Related Art

A connector inspection apparatus for detecting a partial engagement condition of a retainer is disclosed in Japanese Patent Public Disclosure No. HEI 9-82444 (1997). FIG. 11 is a perspective view of such a prior art connector inspection apparatus 230. While performing a continuity test for a terminal 220, this inspection apparatus also detects whether a retainer 210 inserted in a retainer receiving opening 204 formed in a retainer attachment wall 203 of a connector housing 201 is in a full engagement condition or only a partial engagement condition.

A connector 200 is assembled by inserting terminals 220 into cavities 202 formed in an end wall 201a of the connector housing 201, and thereafter inserting a retainer 210 into the retainer receiving opening 204 in the retainer attachment wall 203 so that the retainer 210 engages a latch portion 221 of each terminal 220 in the housing 201, thereby locking the terminals 220 in the housing 201.

The inspection apparatus 230 has a connector holding member 231 with a recessed receiving portion 232 in which the connector 200 is inserted for inspection. An inspection unit 234 may be reciprocated toward and away from the connector holding member 231 in order to perform a continuity test. The inspection unit 234 is moved toward the connector holding member 231 by turning a lever 233 in the direction shown by arrow G, so that a continuity test pin 235 contacts the terminal 220.

In the situation in which the retainer 210 is not properly engaged with the latch portion 221, an outer portion 211 of the retainer 210 projects outwardly from a surface of the retainer attachment wall 203, and thus the retainer is in a partially inserted condition. When the inspection unit 234 is moved toward the connector 200, a contact piece 236 mounted on the inspection unit 234 contacts the projecting outer portion 211 of the retainer 210, and thereby displaces the connector 200. As a result, a positioning plate 242, which is secured by screws 241 through rubber bushes 240 to the recessed receiving portion 232 of the connector holding member 231, is pushed by the connector 200 and is displaced due to elastic deformation of the rubber bushes 240. This makes it possible to visually detect a partially inserted condition of the retainer 210.

In the situation in which the retainer 210 is properly engaged with the latch portion 221, the outer portion 211 of the retainer 210 is aligned with the surface of the retainer attachment wall 203, and thus the retainer is in a fully inserted condition. In the fully inserted condition, the contact piece 236 does not contact the retainer 210, and therefore the positioning plate 242 is not displaced.

In the prior art connector inspection apparatus, even if the retainer 210 is in the partially inserted condition, the lever 233 may be forcibly turned too far. This may result in the contact piece 236 damaging the retainer 210, such as by bending it. This may further result in an inability to detect the partially inserted condition of the retainer.

Also, in the prior art connector inspection apparatus, in the situation where there is an error in the positioning of the contact piece 236 relative to the connector 200, a relative displacement between the contact piece 236 and the retainer 210 will prevent proper detection of a partially inserted condition of the retainer 210.

SUMMARY OF THE INVENTION

Accordingly, an object of the present invention is to provide a connector inspection apparatus that can reliably inspect for a properly locked condition of a retainer and can prevent the retainer from being damaged.

Another object of the present invention is to provide a connector inspection apparatus that can reliably inspect a condition of a retainer.

In order to achieve the above objects, an aspect of the invention is directed to an inspection apparatus for connectors of the type which include a connector housing having a terminal receiving portion with cavities in which terminals are inserted, and a retainer attached to the terminal receiving portion for preventing removal of the terminals from the cavities. In such connectors, an outer portion of the retainer protrudes from a surface of a retainer attachment wall when the retainer is not in a properly locked position for preventing terminal removal, and the outer portion of the retainer does not protrude from the surface of the retainer attachment wall when the retainer is in a properly locked position for preventing terminal removal.

The inspection apparatus according to this aspect of the invention includes a holder for holding the connector during inspection, an inspection unit movable toward and away from the holder, and a movement device that moves the inspection unit toward and away from the holder. The inspection unit includes a retainer position inspection piece which passes over a portion of the surface of the retainer attachment wall when the inspection unit is moved toward the holder by the movement device. The retainer position inspection piece is movable forwardly and rearwardly relative to the inspection unit within a predetermined range.

In the inspection apparatus according to this aspect of the invention, the a distal end of the retainer position inspection piece passes over the outer portion of the retainer during movement of the inspection unit toward the holder when the retainer is in the properly locked position, and the retainer position inspection piece remains in a forwardly movable condition relative to the inspection unit. Further, the distal end of the retainer position inspection piece engages the outer portion of the retainer protruding from the surface of the retainer attachment wall during movement of the inspection unit toward the holder when the retainer is not in the properly locked position, and the retainer position inspection piece is placed in a rearwardly movable condition relative to the inspection unit.

In a further aspect of the present invention, the inspection unit may further include a biasing member that biases the retainer position inspection piece relative to the inspection unit for the relative forward and rearward movement within the predetermined range. The biasing member may include a coil spring.

In a further aspect of the present invention, the inspection unit may further include a continuity test pin configured to contact a terminal within the connector when the inspection unit is moved toward the holder by the movement device. This contact may take place regardless of whether the retainer position inspection piece is in the forwardly movable condition or the rearwardly movable condition.

In a further aspect of the present invention, the inspection unit may further include an electrical detection device that generates electrical signals in response to the forwardly movable condition of the retainer position inspection piece and the rearwardly movable condition of the retainer position inspection piece. The connector may be of the type which includes a hood surrounding at least the terminal receiving portion with a given clearance. The electrical detection device may include a conductive detection piece parallel to and movable with the retainer position inspection piece. The holder may include a pit for holding the connector with the retainer oriented in a lateral position, a conductive detection recess for receiving the conductive detection piece, and a biasing member that pushes the conductive detection piece received in the conductive detection recess toward the pit. A predetermined distance from the conductive detection piece to a surface of the retainer position inspection piece opposed to the retainer attachment wall is such that the retainer position inspection piece slides on the surface of the retainer attachment wall.

Another aspect of the invention is directed to an inspection apparatus for connectors of the type which include a connector housing having a terminal receiving portion with cavities in which terminals are inserted, and a retainer attached to the terminal receiving portion for preventing removal of the terminals from the cavities. In such connectors, an outer portion of the retainer protrudes from a surface of a retainer attachment wall when the retainer is not in a properly locked position for preventing terminal removal, and the outer portion of the retainer does not protrude from the surface of the retainer attachment wall when the retainer is in a properly locked position for preventing terminal removal.

The inspection apparatus according to this aspect of the invention includes a holder for holding the connector during inspection, an inspection unit movable toward and away from the holder, and a movement device that moves the inspection unit toward and away from the holder. The inspection unit includes a retainer position inspection piece which passes over a portion of the surface of the retainer attachment wall when the inspection unit is moved toward the holder by the movement device. The holder including a biasing member that biases one of the connector toward the retainer position inspection piece, or the retainer position inspection piece toward the connector, so that the retainer position inspection piece is adjacent to the surface of the retainer attachment wall when the inspection unit is moved toward the holder by the movement device.

In the inspection apparatus according to this aspect of the invention, a distal end of the retainer position inspection piece passes over the outer portion of the retainer during movement of the inspection unit toward the holder when the retainer is in the properly locked position. Further, the distal end of the retainer position inspection piece engages the outer portion of the retainer protruding from the surface of the retainer attachment wall during movement of the inspection unit toward the holder when the retainer is not in the properly locked position.

In a further aspect of the present invention, the inspection unit may further include a continuity test pin configured to contact a terminal within the connector when the inspection unit is moved toward the holder by the movement device.

In a further aspect of the present invention, the biasing member may further include at least one pushing device that pushes the connector toward the retainer position inspection piece. The holder may further include a recess for holding the connector, the recess including first and second walls. The first wall may include a groove in which the retainer position inspection piece slides, and the second wall may include at least one opening in which the at least one pushing device is mounted for pushing the connector toward the first wall. The second wall may further include two openings in which two pushing devices are mounted for pushing the connector toward the first wall.

In a further aspect of the present invention, the biasing member may further include a pushing device that pushes the retainer position inspection piece toward the connector. The pushing device may include a coil spring and a ball.

In a further aspect of the present invention, the inspection unit may further include an electrical detection device that determines whether the retainer is in the properly locked position. The connector may be of the type which includes a hood surrounding at least the terminal receiving portion with a given clearance. The electrical detection device may include a conductive detection piece parallel to and movable with the retainer position inspection piece. The holder may include a pit for holding the connector with the retainer oriented in a lateral position, and a conductive detection recess for receiving the conductive detection piece. The pushing device may push the conductive detection piece received in the conductive detection recess toward the pit. A predetermined distance from the conductive detection piece to a surface of the retainer position inspection piece opposed to the retainer attachment wall is such that the retainer position inspection piece slides on the surface of the retainer attachment wall.

BRIEF DESCRIPTION OF THE DRAWINGS

The above and other objects, features and advantages of the present invention will be made apparent from the following description of the preferred embodiments, given as non-limiting examples, with reference to the accompanying drawings, in which.

DETAILED DESCRIPTION OF THE PREFERRED EMBODIMENTS

FIGS. 1–3, 6A and 6B show a first embodiment of a connector inspection apparatus in accordance with the present invention.

A first embodiment of a connector 120 that can be inspected by the connector inspection apparatus of the first embodiment will be described with reference to FIGS. 4, 5A and 5B. The connector 120 is of the type disclosed in JP 11-233186, the disclosure of which is herein expressly incorporated by reference in its entirety.

Figure 4:
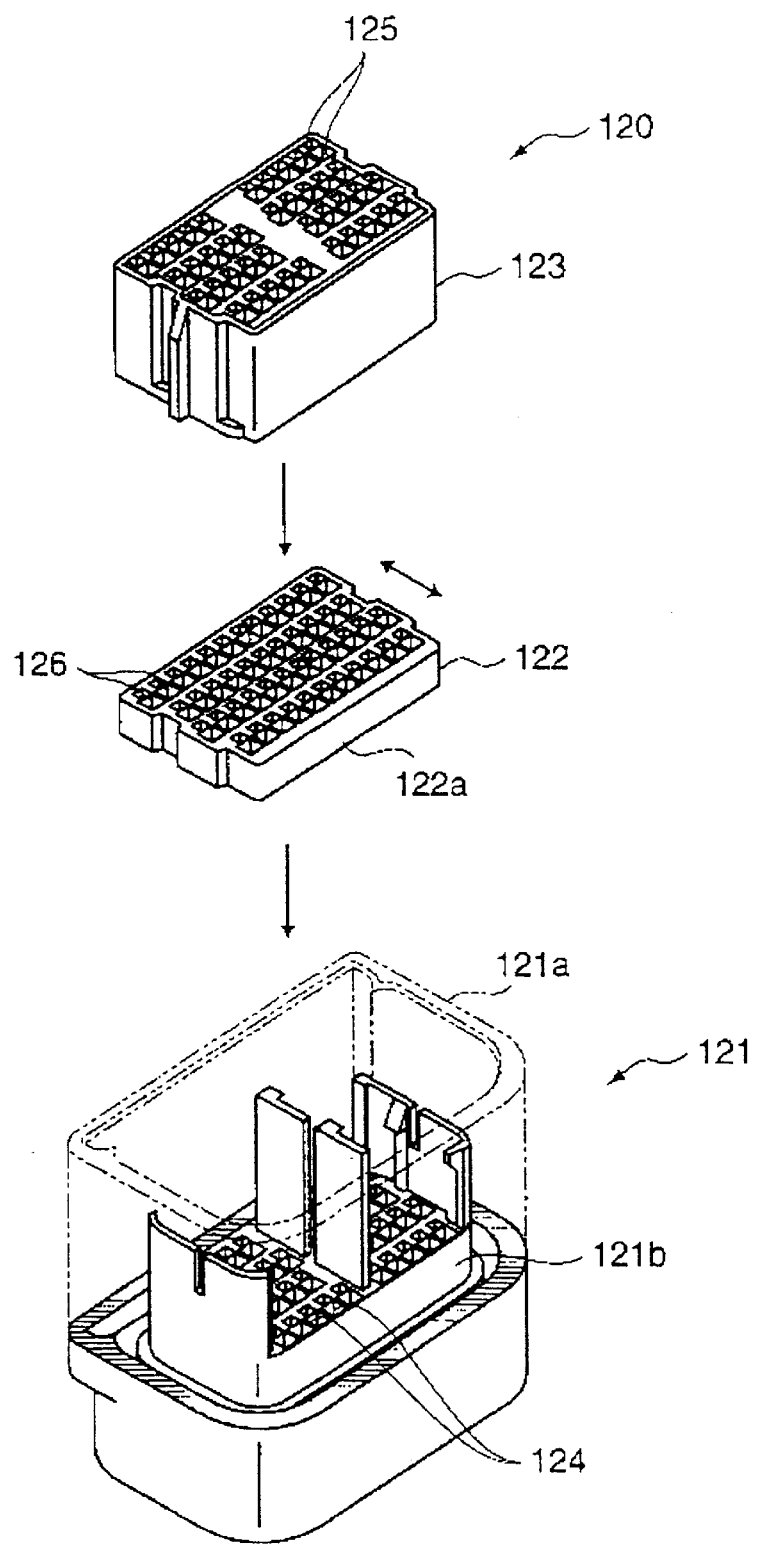
FIG. 4 is an exploded perspective view of a first embodiment of a connector that can be inspected by the connector inspection apparatus of FIG. 1.
Figure 5A:
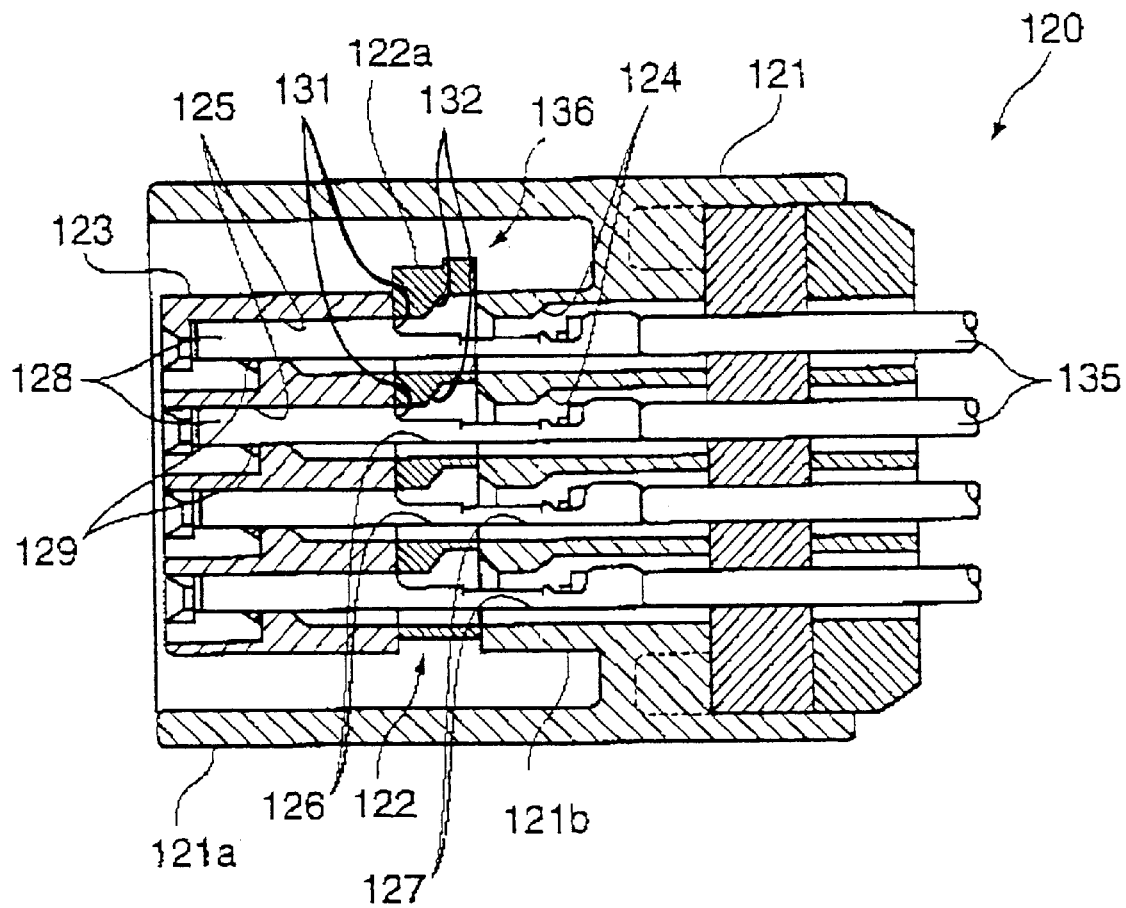
FIG. 5A is a longitudinal sectional view of the connector of FIG. 4, illustrating a temporary engagement condition of a connector.

As shown in FIG. 4, the connector 120 includes a first connector housing 121 having a hood 121a, a retainer 122 attached to the first housing 121, and a second connector housing 123 attached to the first housing 121 through the retainer 122 so that they are assembled as shown in FIG. 5A. The open end of the hood 121a (the left end in FIGS. 5A and 5B) is defined as the front end.

The first housing 121 includes a first terminal receiving portion 121b surrounded by the hood 121a. One side of the retainer 122 contacts a front end surface of the first housing 121 within the hood 121a. The second housing 123 includes a second terminal receiving portion, and contacts the opposite side of the retainer 122. Cavities 124 formed in the first terminal receiving portion 121b communicate through communication holes 126 formed in the retainer 122 with cavities 125 formed in the second housing 123 to define terminal insertion holes 127. The hood 121a surrounds the whole second housing 123 and a part of the first housing 121 at the front end.

Figure 5B:
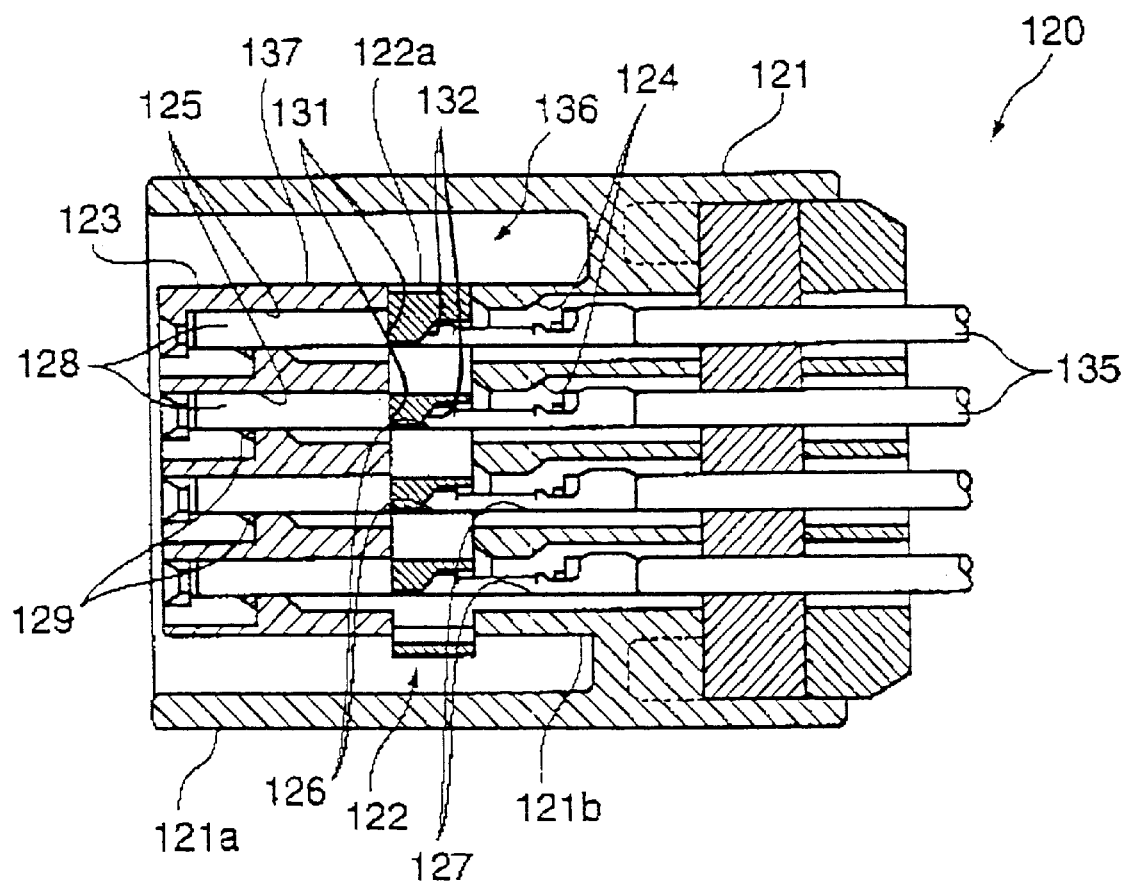
FIG. 5B is a longitudinal sectional view of the connector of FIG. 4, illustrating a locked engagement condition of a connector.

A female terminal 128 connected to an electrical wire 135 can be inserted into each terminal insertion hole 127 in a direction from the right side (rear side) to the left side (front side) in FIGS. 5A and 5B. When the female terminal 128 is inserted at a proper position in the terminal insertion hole 127, a metal lance 129 provided in the second housing 123 temporally locks the female terminal 128 in place. At this time, the outermost portion 122a of the retainer 122 protrudes into a clearance 136 between the hood 121a and the second housing 123.

Thereafter, the retainer 122 is pushed down, such as by insertion of a jig or tool into the clearance 136 for engagement with the outermost portion 122a. As shown in FIG. 5B, a lock pawl 132 of the retainer 122 enters a jaw 131 of the female terminal 128, thereby locking the terminal 128 in the housings. Also, the outermost portion 122a of the retainer 122 achieves a position substantially aligned with, or flush with, a surface of a retainer attachment wall 137. The retainer attachment wall 137 includes a side surface of the first terminal receiving part 121b and a side surface of the second housing 123.

Next, the first embodiment of the connector inspection apparatus in accordance with the present invention will be explained with reference to FIGS. 1–3, 6A and 6B. The connector inspection apparatus includes a bed 1, a holder 10 secured on a left end of the bed 1, an inspection unit 20 disposed above the bed 1 on a right side with respect to the holder 10, and a lever 2 with a handle 2b supported rotatably on a right upper end of the bed 1 for moving the inspection unit 20 to the left and right along the direction E.

The bed 1 includes a pair of lever attachment portions 3 and a pair of rails 4 disposed on an upper side of the bed. The lever 2 is rotatably supported on the lever attachment portions 3 through axles 5. The pair of rails 4 extend in parallel to each other on the bed 1 and each rail 4 is provided on an upper portion with an outwardly extending flange 4a.

Figure 1:
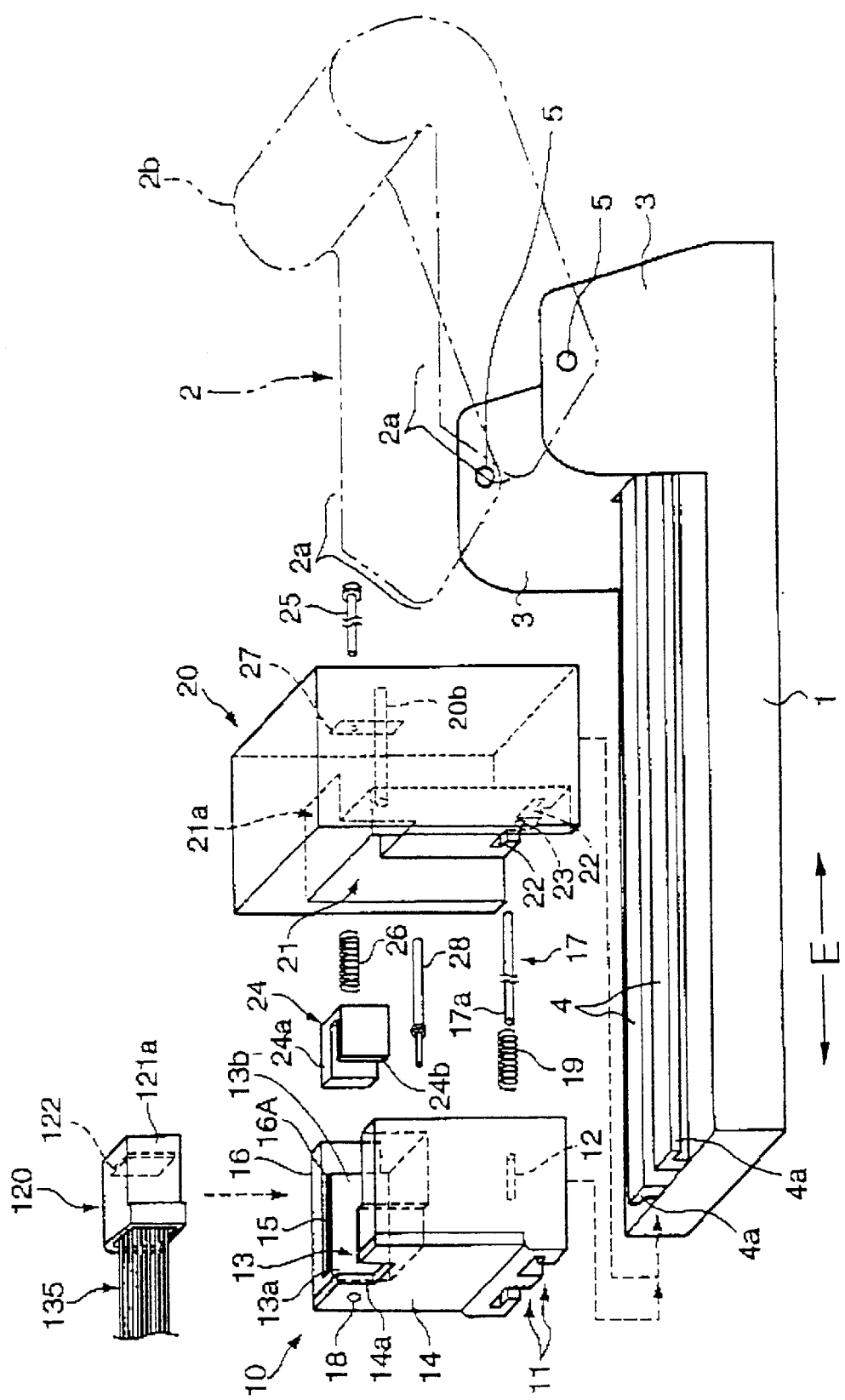
FIG. 1 is an exploded perspective view of a first embodiment of a connector inspection apparatus in accordance with the present invention.

The holder 10 includes a pair of receiving grooves 11 in the bottom and a pin-receiving aperture 12 extending between the grooves 11. The two receiving grooves 11 are formed longitudinally in a lower portion of the holder 10. The holder 10 is mounted on the bed 1 by inserting the rails 4 into the grooves 11. The holder 10 may be held in position on the bed 1 in any suitable manner, such as with a screw extending from the bottom surface of the bed 1 to the holder 10. The pin-receiving aperture 12 is formed in a wall portion between the two receiving grooves 11 so as to extend horizontally from a right side end surface into a central portion of the holder 10. A left end portion 17a of a pin 17 shown in FIG. 1 is inserted into and secured in the pin-receiving aperture 12 in any suitable manner.

A connector inspection pit 13 is provided in an upper portion of holder 10. A connector 120, supporting electrical wires 135 and retainer 122, is inserted into the pit 13 through a top inlet thereof. A metal stopper plate 14 is secured to the holder 10 at the left side of the pit 13. A conductive detection recess 15 is provided behind the connector inspection pit 13, and a stopper 16 protrudes from the right end of the holder 10.

In addition to the top inlet, the connector inspection pit 13 has left and right side openings 13a and 13b. The pit 13 has a shape and dimensions suitable for receiving the connector 120 with the retainer 122 oriented laterally (for example, perpendicular to the direction E). The connector 120 can be set in the pit 13 only when the retainer 122 is oriented in the lateral position. The stopper plate 14 secured to the left side of the pit 13 is provided with a recess 14a that communicates with the left side opening 13a. The electrical wires 135 of a connector 120 set in the pit 13 extend from the recess 14a, and the open end of the hood 121a of the connector 120 is exposed through the right side opening 13b.

The conductive detection recess 15 is partitioned from the pit 13 by a wall 16A to define a certain width in a longitudinal direction and right and left side open ends. A retainer position inspection pin 18 is secured to the stopper plate 14 and protrudes into the left open end of the conductive detection recess 15. An elastic pushing member 9, which may include any suitable biasing device, such as a ball 9a and a compression coil spring, is disposed in an inner side wall of the recess 15 so that a portion of the ball 9a projects from the inner side wall.

The inspection unit 20 disposed at the right side of the holder 10 has a recess 21 in a wall opposed to the holder 10. The recess 21 receives a right side portion of the holder 10 when the inspection unit 20 is moved toward the holder 10 along the direction E. A deepened portion 21a of the recess 21 receives the protruding stopper 16. A pair of guide grooves 22 are formed in the inspection unit 20 below the recess 21, and a through-aperture 23 is formed in a wall between the guide grooves 22. Each rail 4 enters a respective guide groove 22, and a right side end portion 17b of the pin 17 enters slidably into through-aperture 23. A compression coil spring 19 surrounds the pin 17 and can be compressed between the holder 10 and the inspection unit 20. Any other suitable biasing device could also be provided.

Figure 3:
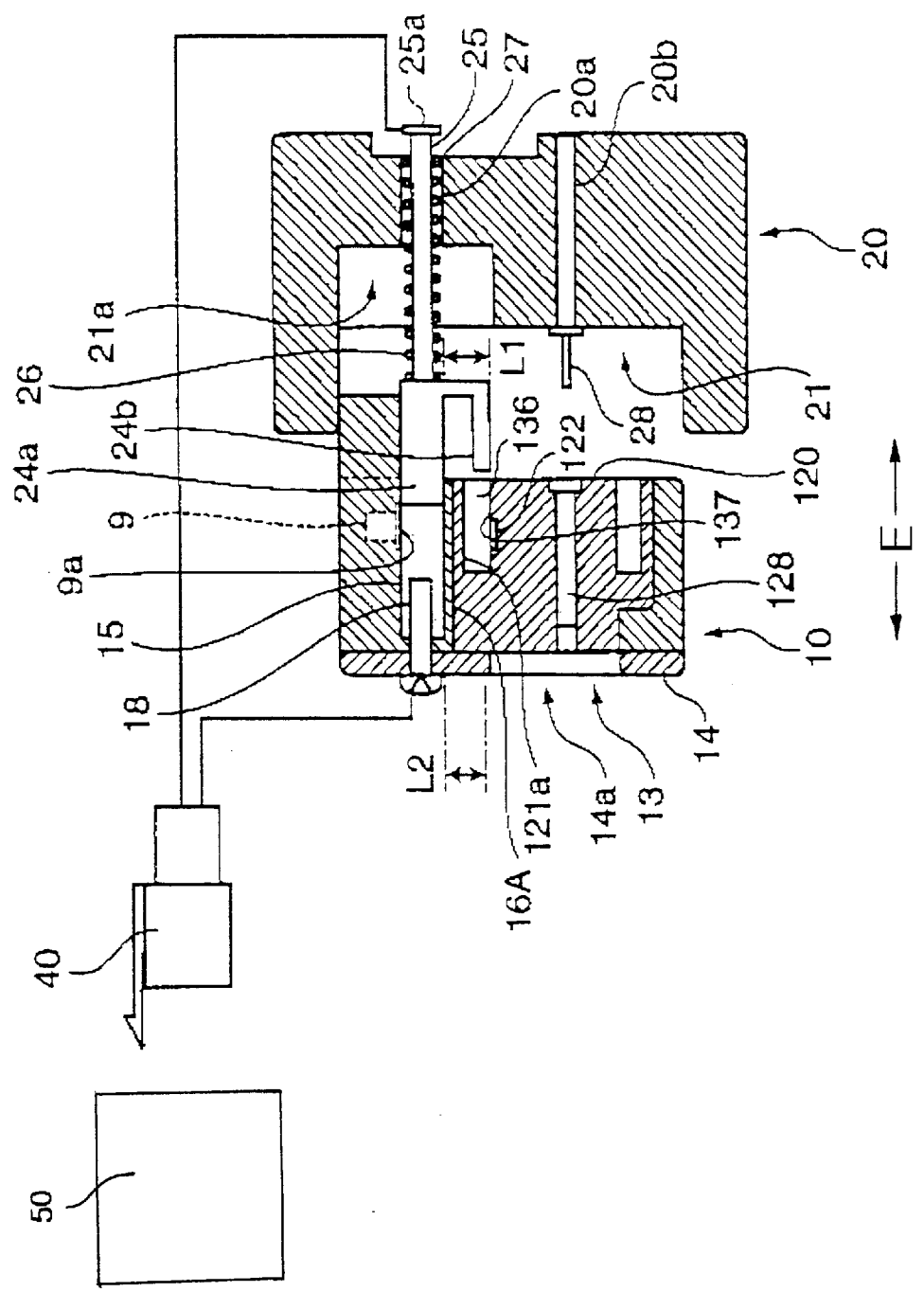
FIG. 3 is a sectional plan view of the connector inspection apparatus of FIG. 1.

A retainer position inspection member 24 and a continuity test pin 28 are disposed in an upper portion of the recess 21. The retainer position inspection member 24 includes on the left side thereof a U-shaped body having a longer conductive detection piece 24a, a shorter retainer position detection piece 24b, and a proximal connecting portion. The connecting portion is supported at its right side on the inspection unit 20 by a supporting pin 25 that is coupled to the connecting portion. In more detail, as shown in FIG. 3, the supporting pin 25 extends through a horizontal through-hole 20a from the right end with its distal end protruding toward the holder 10. An enlarged portion 25a of the pin 25 serves to prevent the pin 25 from coming out of the through-hole 20a.

A compression coil spring 26 surrounds the supporting pin 25 is contained between a stopper 27, fixed in a right side end of through-hole 20a, and the retainer position inspection member 24. Consequently, the retainer position inspection member 24 can move forward and backward in the recess 21 relative to the remainder of inspection unit 20 due to the sliding engagement of supporting pin 25 in through-hole 20a. When the inspection unit 20 moves toward holder 10 along the direction E, the right end portion of the retainer position inspection member 24 enters the deepened portion 21a of recess 21.

The longer conductive detection piece 24a remains in the conductive detection recess 15 during forward and backward movement of the inspection unit 20, as shown in FIG. 3. The piece 24a enters the recess 15 deeply when the inspection unit 20 moves forward toward holder 10 along the direction E. At the same time, the shorter retainer position detection piece 24b enters a clearance 136 (see FIG. 3) defined between the hood 121a of the connector 120 located in the pit 13 and the retainer 122 attached to the connector 120.

The conductive detection piece 24a is pushed against the wall 16A by the ball 9a of the elastic pushing member 9 provided in the conductive detection recess 15 while the inspection unit 20 moves forward toward holder 10 along the direction E. Note that the retainer position detection piece 24b will not engage, and be stopped by, the retainer 122 if the retainer 122 is in the properly locked condition within the connector. That is, the retainer position detection piece 24b will pass over the retainer position inspection position on the surface of the retainer attachment wall 137 adjacent the outermost portion 122a of the retainer 122. The piece 24b will engage, and be stopped by, the retainer 122 only if the retainer 122 is not in the properly locked condition within the connector, such that the outermost portion 122a of the retainer 122 protrudes outwardly from the surface of the retainer attachment wall 137. The respective dimensions of the retainer position inspection member 24 and holder 10 are such that a distance L1 between a lower side surface of the conductive detection piece 24a and a lower side surface of the retainer position detection piece 24b, as shown in FIG. 3, is substantially the same as a distance L2 between an upper side surface of the wall 16A and the outermost portion 122a of a retainer 122 in a properly locked condition within a connector. This structure ensures a high precision retainer position inspection, even if a thickness of the conductive detection piece 24a is less than a width of the conductive detection recess 15, that is, even if the retainer position inspection member 24 engages the holder 10 and connector 120 with a play.

The supporting pin 25 and retainer position inspection pin 18 are connected to a retainer position inspection connector 40, which may be further connected to a retainer position inspection device 50. This retainer position inspection device 50 determines whether the retainer 122 is in the properly locked condition within a connector, for example, when the supporting pin 25 and retainer position inspection pin 18 are brought into a continuity condition, and determines that the retainer 122 is not in the properly locked condition, for example, when the pins 25 and 18 are kept in a non-continuity condition. The retainer position inspection pin 18, retainer position inspection member 24, and supporting pin 25 are made of a conductive material. The supporting pin 25, retainer position inspection pin 18, retainer position inspection connector 40, and retainer position inspection member 24 (in particular, conductive detection piece 24a) constitute an electrical detection device.

The continuity test pin 28 is inserted into and fixed in the receiving hole 20b extending horizontally in the inspection unit 20 so that the distal end of the pin 28 projects toward the holder 10 by a predetermined length. The continuity test pin 28 is disposed at a position to be connected to the female terminal 128 of the connector 120 located in the pit 13.

The inspection unit 20 is moved forward and backward along the direction E with respect to the holder 10 by the lever 2. In more detail, the lever 2 can rotate about the axles 5, as shown in FIG. 1. The lever 2 is provided on the left side curved end surface 2a (opposed to the inspection unit 20) with a cam surface having various distances or radii from the axles 5. When the lever 2 is turned from a horizontal position A shown by a solid line in FIG. 2 to a vertical position B shown by a dotted line, the inspection unit 20 is moved forward along the direction E until it contacts the holder 10, thereby stopping the inspection unit 20 at the inspection position. Then, the conductive detection piece 24a enters the inner part of the conductive detection recess 15, the retainer position inspection piece 24b enters the clearance 136, and the continuity test pin 28 contacts the female terminal 128.

When the lever 2 is turned from the vertical position B to the horizontal position A, the inspection unit 20 is moved backward along the direction E and is returned to the original standby position where the inspection unit 20 comes into contact with the lever attachment portions 3. A connector 120 can be placed in or removed from the pit 13 without interference while the inspection unit 20 is in the standby position.

Next, an operation of the first embodiment of the connector inspection apparatus in accordance with the present invention will be explained.

First, an operator should confirm whether the lever 2 is returned to the original horizontal position. Then, the connector 120 is placed in the pit 13 so that the retainer 122 is directed laterally and the front side of the connector 120 is directed toward the inspection unit 20. Thereafter, the lever 2 is turned from the horizontal position A to the vertical position B. The inspection unit 20 is moved forward along the direction E toward the holder 10 until it contacts the holder 10.

Figure 6A:
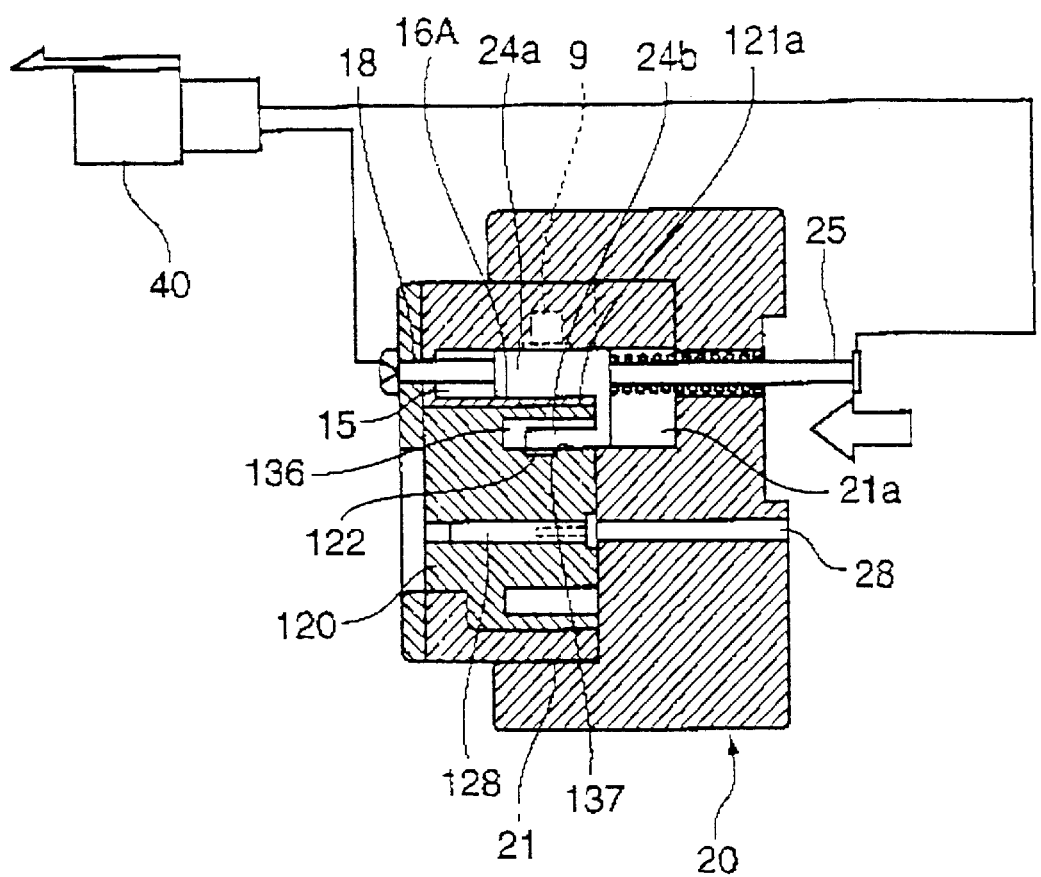
FIG. 6A is a sectional plan view of the connector inspection apparatus of FIG. 1 during connector inspection, illustrating a fully inserted condition of a retainer.

In the situation in which the retainer 122 is in the proper locked condition within the connector 120, as shown in FIG. 6A, the right side portion of the holder 10 enters the recess 21 in the inspection unit 20 and the continuity test pin 28 contacts the female terminal 128. After the retainer position inspection piece 24b enters the clearance 136 between the retainer 122 and the hood 121a, the piece 24b passes over the retainer position inspection position, and the outermost portion 122a of the retainer 122, while the elastic pushing member 9 pushes the conductive detection piece 24a against the wall 16A. Consequently, the conductive detection piece 24a enters the inner part of the conductive detection recess 15 and contacts the retainer position inspection pin 18. The supporting pin 25 and retainer position inspection pin 18 are brought into a continuity condition. The retainer position inspection device 50 detects the retainer 122 in the properly locked condition.

Figure 6B:
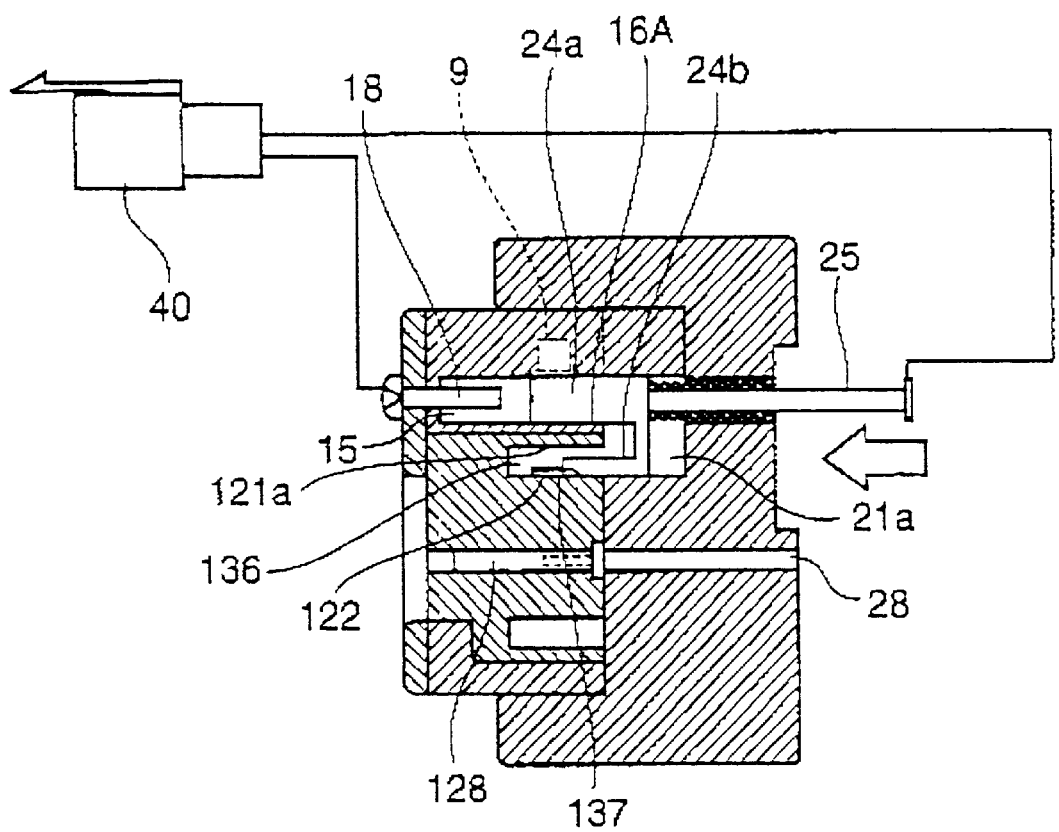
FIG. 6B is a sectional plan view of the connector inspection apparatus of FIG. 1 during connector inspection, illustrating a partially inserted condition of a retainer.

In the situation in which the retainer 122 is not in the proper locked condition within the connector 120, as shown in FIG. 6b, the right portion of the holder 10 enters the recess 21 in the inspection unit 20 and the continuity test pin 28 contacts the female terminal 128, in the same manner as with the proper locked condition of retainer 122. However, after the retainer position inspection piece 24b enters the clearance 136, the piece 24b engages the protruding outermost portion 122a of the retainer 122, and the retainer position inspection member 24 is pushed back along the direction E. Consequently, the conductive detection piece 24a does not reach the inner part of the conductive detection recess 15 and does not contact the retainer position inspection pin 18. The supporting pin 25 and retainer position inspection pin 18 remain in the non-continuity condition. The retainer position inspection device 50 detects that the retainer 122 is not in the properly locked condition.

No matter whether the retainer 122 is in the properly locked condition during inspection, the continuity test pin 28 contacts the female terminal 128 in the connector 120. Accordingly, it is possible to carry out a continuity test of the female terminal 128 regardless of whether the retainer 122 is in the properly locked condition.

Therefore, it is possible in the first embodiment to prevent the retainer from being damaged, since the retainer position inspection member 24 is pushed back along the directions E when the retainer position inspection piece 24b abuts the outermost portion 122a of the retainer 122. The retainer position inspection device 50 can detect electrically the condition of the retainer 122 in accordance with the continuity condition between the supporting pin 25 and the retainer position inspection pin 18 through the retainer position inspection member 24. Consequently, it is possible to reliably inspect the properly locked condition of the retainer 122. In addition, the continuity test pin 28 couples with the female terminal 128 regardless of the condition of the retainer, when the inspection unit 20 is moved forward with respect to the holder 10. It is possible to decide whether only the condition of the retainer is improper, whether only the attachment of the terminal is improper, whether both of the condition of the retainer and the attachment of the terminal are improper, or whether both of the condition of the retainer and the attachment of the terminal are proper, in accordance with the results of the continuity test and inspection.

In the first embodiment mentioned above, since the elastic pushing member 9 pushes the conductive detection piece 24a against the wall 16A, it is possible to maintain a spaced distance between the wall 16A and the surface of the retainer attachment wall 137 at a given amount. Since a distance from the conductive detection piece 24a to the surface of the retainer position inspection piece 24b is set to be a distance L1, the retainer position inspection piece 24b can pass over the retainer position inspection position while sliding on the surface of the retainer attachment wall 137. Consequently, it is possible to reliably detect the improper, unlocked condition in which the retainer surrounded by the hood protrudes slightly from the surface of the retainer attachment wall.

Although the conductive detection piece 24a is provided on the distal end of the retainer position inspection member 24 in the same manner as the retainer position inspection piece 24b, and the retainer position inspection pin 18 is provided at a side of the conductive detection piece 24a to detect the properly locked condition of the retainer in the embodiment described above, the present invention is not limited to this structure. For example, the conductive detection piece 24a may be replaced by the retainer position inspection piece 24b on the proximal end of the retainer position inspection member 24 and the retainer position inspection pin 18 may be provided at the side opposite to the conductive detection piece 24a to detect the improper, unlocked condition of the retainer.

Although a connector inspected is one in which the outermost portion of the retainer is flush with the terminal receiving portion and does not project outside in the above embodiment, the present invention is not limited to this connector. For example, a connector with a hood in which the outermost portion of the retainer projects from the terminal receiving portion by any amount, or a connector with a hood in which the outermost portion of the retainer is aligned with the terminal receiving portion may also be inspected. In this situation, the distances L1 and L2 may be set so that the retainer position inspection piece 24b can pass over the retainer position inspection position spaced by a certain amount away from a side surface of the terminal receiving portion.

Figure 7:
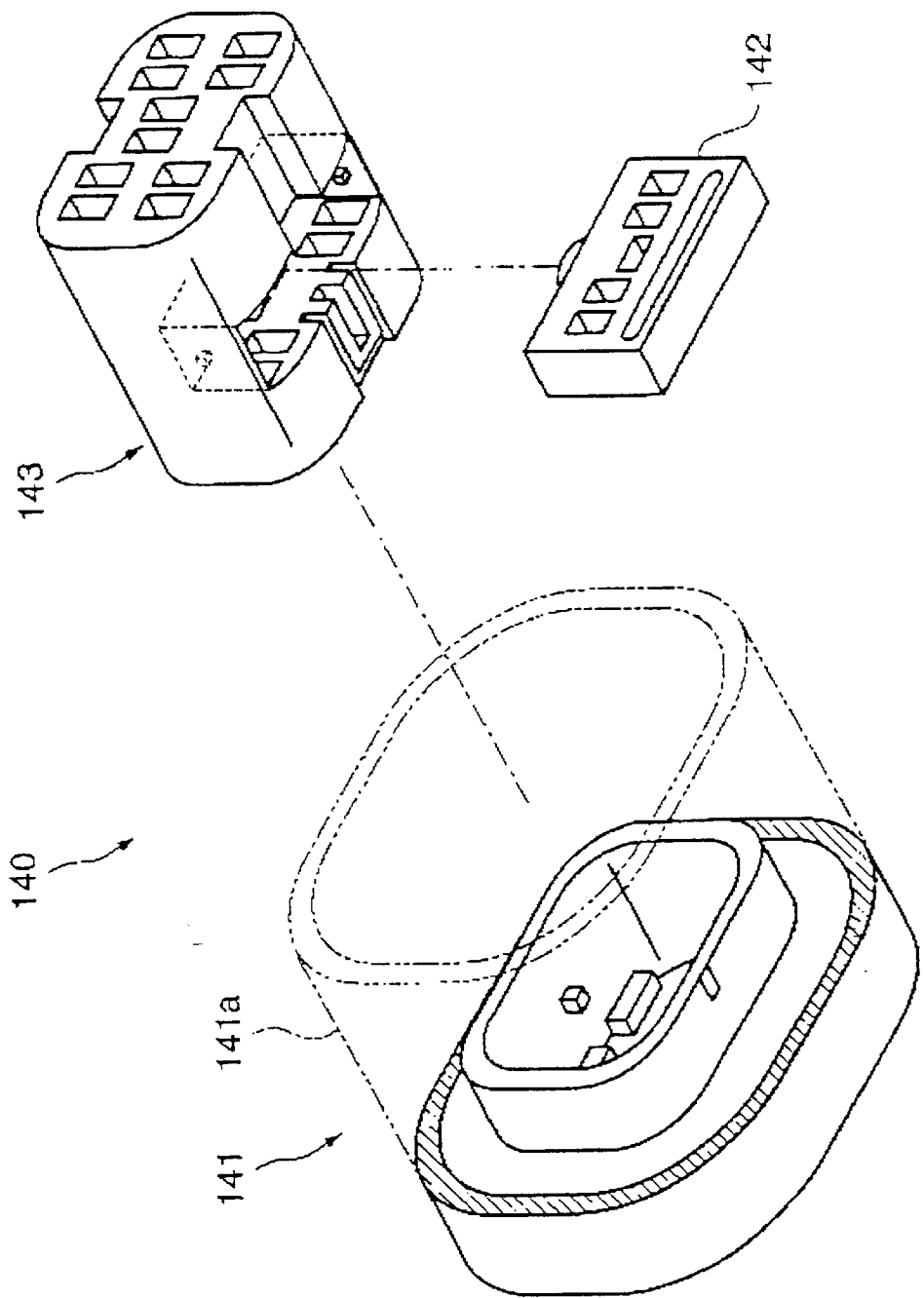
FIG. 7 is an exploded perspective view of a second embodiment of a connector that can be inspected by the connector inspection apparatus of FIG. 1.

Although in the first embodiment the retainer 122 and second housing 123 are disposed in the hood 121a of the first housing 121 in order, as shown in FIG. 4, the present invention is not limited to this connector. For example, as shown in FIG. 7, the present invention may be applied to a connector 140 in which a retainer 142 is attached to a second housing 143 and then the second housing 143 is disposed in a hood 141a of a first housing 141.

A connector to be inspected by the apparatus of the present invention need not be a connector in which the hood surrounds a portion of the terminal receiving part as described in the first embodiment, but may also be a connector in which a hood surrounds an entire terminal receiving part.

A connector to be inspected may be a connector with no hood. In this case, an outer surface of the connector is an outer surface of a terminal receiving part, and a portion of the retainer protrudes from the connector when the retainer is in an improper, unlocked condition. Accordingly, it is preferable to widen the connector-setting pit so as to accommodate the protruding portion and so as to pass the retainer position inspection piece through a clearance.

Next, a second embodiment of a connector inspection apparatus in accordance with the present invention will be described by referring to FIGS. 8 through 10.

Figure 8:
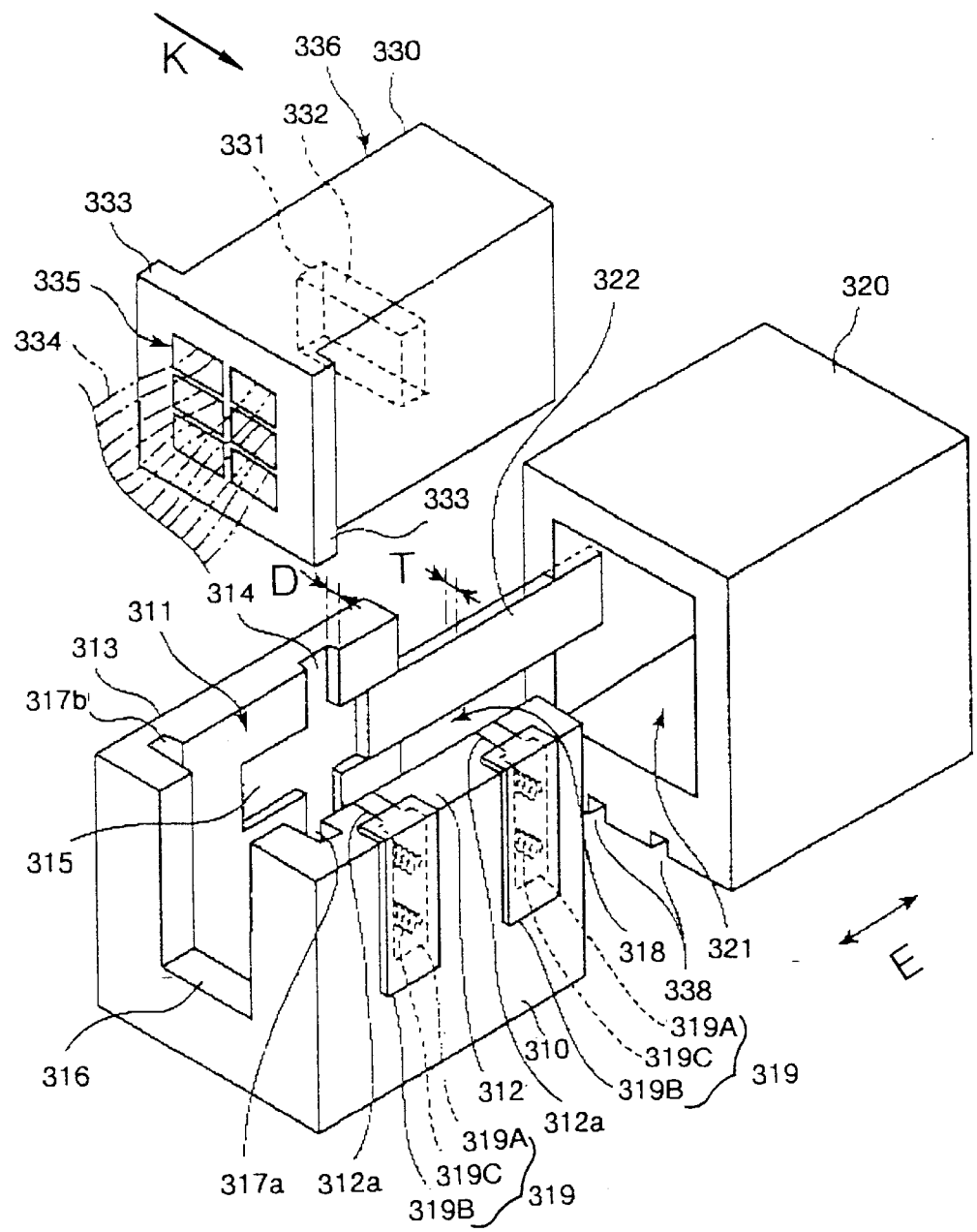
FIG. 8 is a perspective view of a second embodiment of a connector inspection apparatus in accordance with the present invention.
Figure 9:
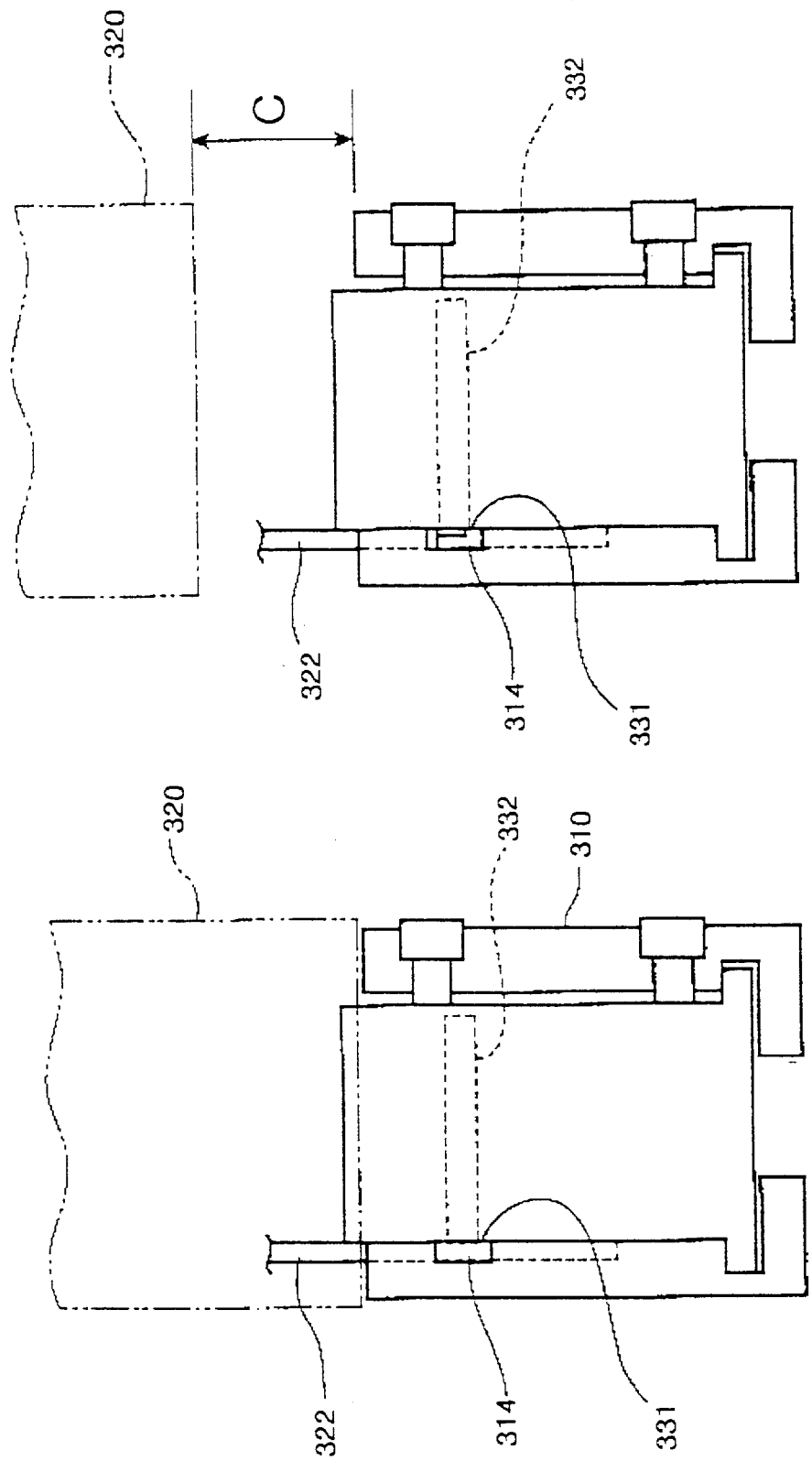
FIG. 9A is a plan view of the connector inspection apparatus of FIG. 8 during connector inspection, illustrating a fully inserted condition of a retainer.
FIG. 9B is a plan view of the connector inspection apparatus of FIG. 8 during connector inspection, illustrating a partially inserted condition of a retainer.

FIG. 8 is an exploded perspective view of a main part of the second embodiment of the connector inspection apparatus in accordance with the present invention. The holder 310 is provided on an upper portion with a connector-setting pit 311 in which a connector 330 is set. The connector 330 has a plurality of cavities 335 in which terminals can be inserted, respectively. A retainer 332 is inserted in a direction K in FIG. 8 into a retainer-receiving hole 331 formed in the connector 330 through a surface of a retainer attachment wall 336 that defines the respective sidewalls of the cavities 335. The retainer 332 serves to prevent the terminals from coming out from the cavities 335. The retainer 332 is disposed laterally on the inner part of the connector-setting pit 311. Each electrical wire 334 connected to each terminal is led out from the rear side end of the connector 330.

The connector-setting pit 311 with a given width has a pair of walls 312 and 313. A first groove 314 is formed vertically in the wall 313 so as to permit passage of the retainer 332 disposed in the connector 330. A second groove 315 for retainer position inspection with a given width is formed in the wall 313 horizontally. Although a part of the retainer 332 protrudes from the surface of the retainer attachment wall when the retainer 332 is inserted in the connector 330 in a improper, unlocked condition, the first groove 314 can pass the projecting part of the retainer 332, thereby enabling the connector 330 to be set in the connector-setting pit 311. The second groove 315 will be described hereinafter.

The connector-setting pit 311 is provided on the left end portion with an opening 316 through which electrical wires 334 connected to the terminals to be inserted into the connector 330 pass. Elongate grooves 317a and 317b are formed on the right side of the opening 316 in the walls 312 and 313, respectively so that flanges 333 formed on the left end of the connector 330 can enter the grooves 317a and 317b. The engagement of the flanges 333 with the grooves 317a and 317b prevents the connector 330 from coming out from the connector-setting pit 311. The connector-setting pit 311 is provided on a right end portion with an opening 318 so that a front side end (at a side opposite to the electrical wires 334) of the connector 330 is accessible through the opening 318. The inside surface of the wall 312, except for the groove 317a, is formed into a flat surface similar to the side surface of the connector 330, except for the flanges 333.

Figure 10:
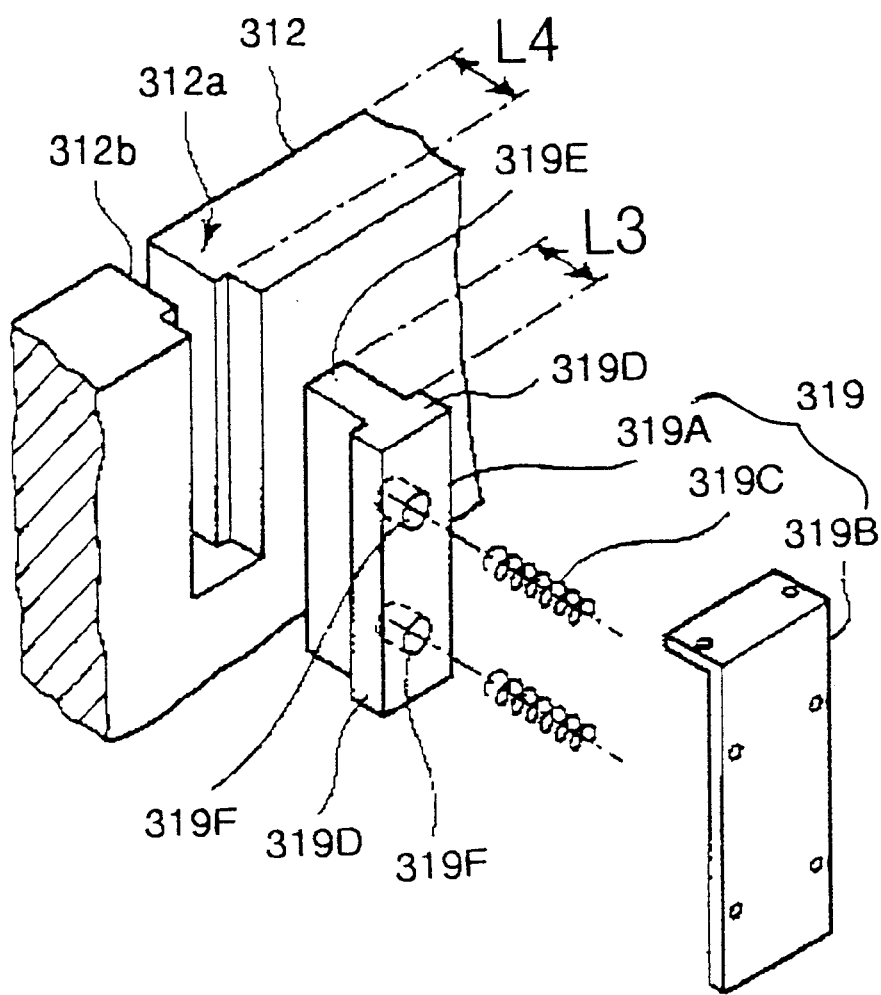
FIG. 10 is an exploded perspective view of a pushing device provided in the connector inspection apparatus of FIG. 8.
Figure 11:
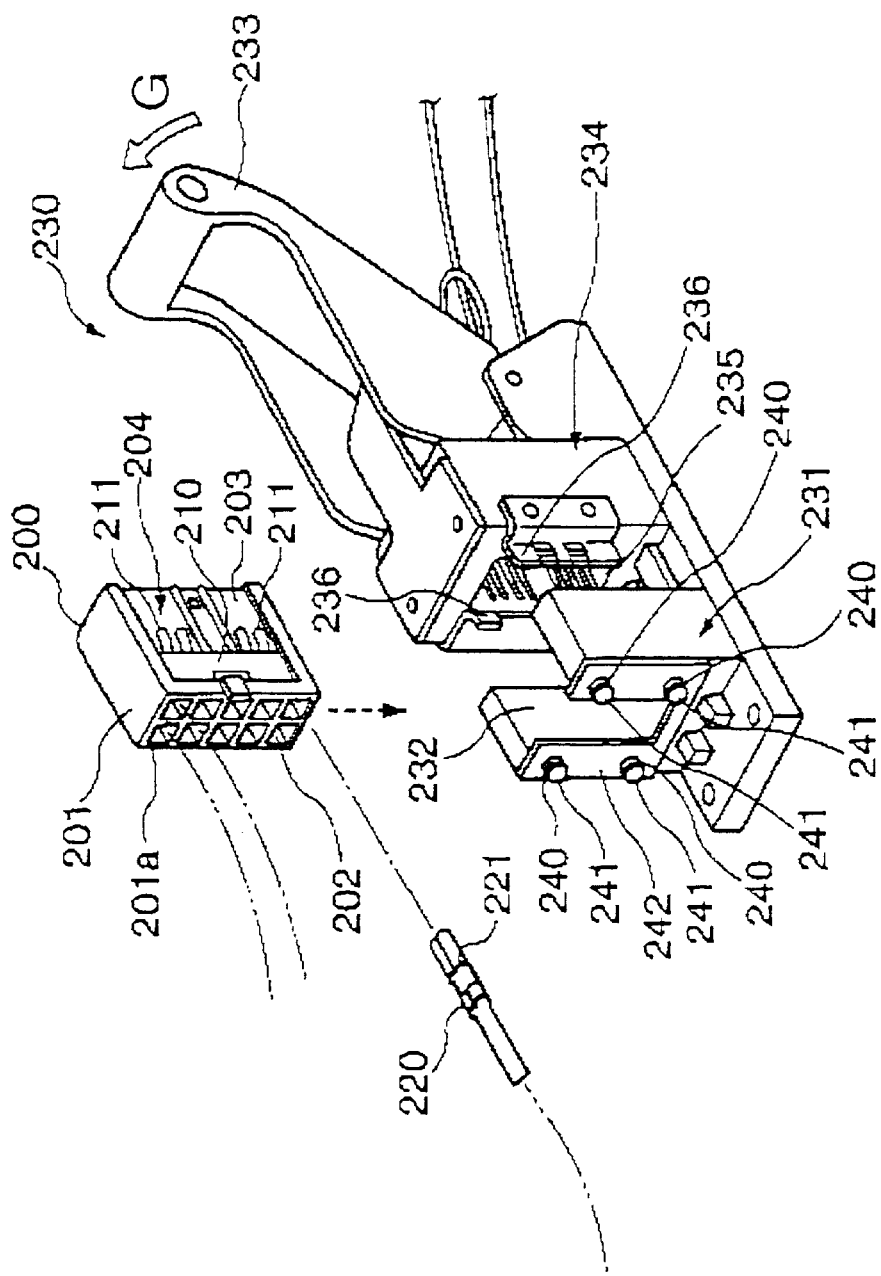
FIG. 11 is a perspective view of a prior art connector inspection apparatus.

A pair of pushing devices 319 are provided on the wall 312 and spaced away from each other along the direction E as shown in FIGS. 8 and 10. The pushing devices 319 have the same constructions. Each pushing device 319 includes a connector pressing plate 319A configured to be inserted into a stepped hole 312a formed in the wall 312, a spring stopper plate 319B having an L-shaped cross section for covering the outside of the stepped hole 312a, and compression coil springs 319C disposed between the connector pressing plate 319A and the spring stopper plate 319B. The connector pressing plate 319A has flanges 319D on the side opposed to the spring stopper plate 319B so that the connector pressing plate 319A does not come out from the stepped hole 312a even if the plate 319A is pushed toward the inner surface of the wall 312 by an elastic force exerted in the compression coil springs 319C. The connector pressing plate 319A includes a pressing portion 319E having a width narrower than a lateral distance between the flanges 319D. A length L3 of the pressing portion 319E is slightly longer than a thickness L4 of a narrower hole portion 312b of the stepped hole 312a, thereby pushing the connector 330 against the wall 313 (see FIG. 8). The connector pressing plate 319A is provided in a portion opposed to the spring stopper plate 319B with spring receiving holes 319F with bottoms for receiving the compression coil springs 319C. A depth of the spring receiving hole 319F is adjusted in accordance with a compression length of the compression coil spring 319C.

The inspection unit 320 is provided in the bottom with two grooves 338 extending along the direction E. The grooves 338 respectively receive two rails secured on a bed, in similar fashion to bed 1 of the first embodiment, so that the inspection unit 320 slides on the bed along the direction E. The inspection unit 320 is provided in a side opposed to the holder 310 with an opening 321 into which a front end portion of the connector 330 is inserted. The retainer position inspection piece 322 is fixed on the inner surface of the opening 321 with a distal end of the piece 322 being horizontally directed to the second groove 315 in the holder 310. The retainer position inspection piece 322 is aligned with the inner surface of the opening 321 by attaching a proximal end of the piece 322 to a recess formed in the inner surface of the opening 321. A thickness T of the retainer position inspection piece 322 is substantially the same as a depth D of the second groove 315. The outer surface of the retainer position inspection piece 322 is flush with the inner surface of the wall 313.

Figure 2:
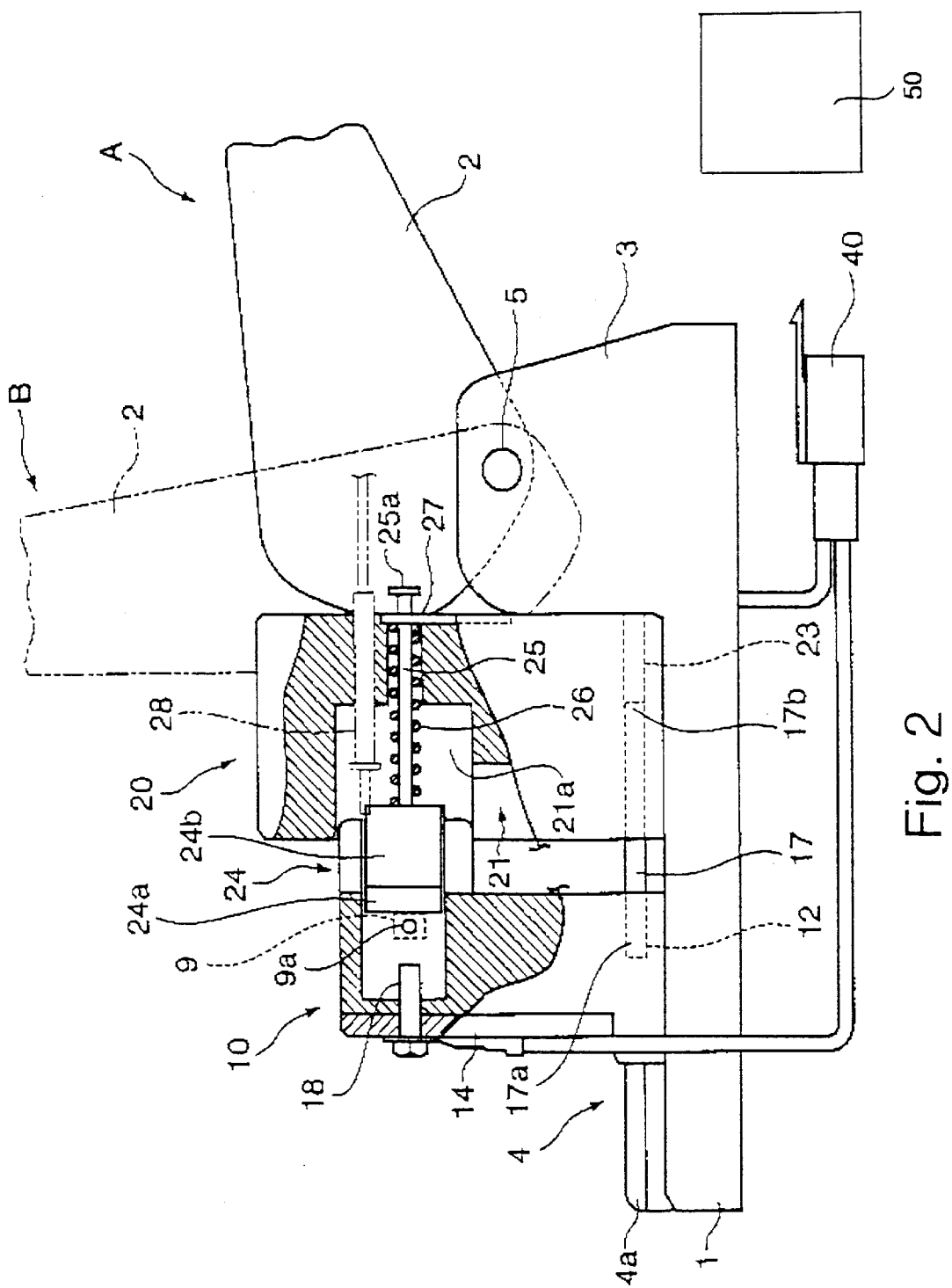
FIG. 2 is a partial sectional side elevation view of the connector inspection apparatus of FIG. 1.

As described hereinbefore in association with the first embodiment shown in FIGS. 1 and 2, the inspection unit 320 is coupled to a lever 2 through a link 3. When the lever 2 is turned from a horizontal position to a vertical position, the inspection unit 320 is moved forward with respect to the holder 310 and is brought into contact with the holder 310. When the lever 2 is turned from the vertical position to the horizontal position, the inspection unit 320 is retracted to the original standby position. When the inspection unit 320 is in the standby position, the distal end of the retainer position inspection piece 322 is inserted in the second groove 315, thereby steadily guiding the piece 322 in the second groove 315 during sliding movement of the inspection unit 320.

Next, an inspection method using the second embodiment of the connector inspection apparatus mentioned above will be described.

First, the connector 330 in which terminals and retainer 332 are installed is set in the connector-setting pit 311 of the holder 310 in a normal condition. At this time, the connector 330 is pushed against the wall 313 by pushing devices 319 and the second groove 315 is covered with the surface of the retainer attachment wall 336 of the connector 330. The inspection unit 320 is moved toward the holder 310 by the lever 2. Then, the retainer position inspection piece 322 is led into the second groove 315 that is covered with the surface of the retainer attachment wall 336 of the connector 330. Since the depth D of the groove 315 is substantially the same as the thickness T of the fitting inspection piece 322, the retainer position inspection piece 322 smoothly slides in the second groove 315.

FIG. 9a is a plan view of the connector inspection apparatus, illustrating a proper locked condition of a retainer 332. FIG. 9b is a plan view of the connector inspection apparatus, illustrating an improper, unlocked condition of a retainer 332. In the case where the retainer 332 is in the proper locked condition, as shown in FIG. 9a, since the retainer 332 does not project from the surface of the retainer attachment wall 336, the distal end of the retainer position inspection piece 322 passes over the retainer-receiving hole 331 and the inspection unit 320 comes into contact with the holder 310. On the contrary, in the case where the retainer 332 is in the improper, unlocked condition, as shown in FIG. 9b, since the retainer 332 projects from the surface of the retainer attachment wall 336, the distal end of the retainer position inspection piece 322 guided into the second groove 315 abuts against the projecting portion of the retainer 332, thereby stopping the lever 2 from turning. At this time, since the inspection unit 320 does not come into contact with the holder 310, a clearance C is defined between the inspection unit 320 and the holder 310 (see FIG. 9b). This clearance C indicates that the retainer 332 is in the half fitting condition in the connector 330.

Accordingly, in this embodiment, if the retainer 332 projects slightly from the surface of the retainer attachment wall 336, since the retainer position inspection piece 322 slides on the surface of the retainer attachment wall 336, the retainer position inspection piece 322 abuts against the projecting portion of the retainer 332. Thus, it is possible to reliably inspect whether an engagement of the retainer with the connector is in a properly locked condition. Also, since the pushing devices 319 are juxtaposed to push the connector 330 in parallel in the holder 310, it is possible to push the front and rear ends in parallel and to push the whole side surface of the connector 330 against the wall 313, thereby enhancing an accuracy of retainer position inspection.

Although the two pushing devices 319 are provided in the embodiment described above, more than two pushing devices may be provided.

Although the inspection unit 320 is moved forward with respect to the holder 310 by the lever in the second embodiment, the holder 310 may be moved backward with respect to the inspection unit 320, or both of the holder 310 and inspection unit 320 may be moved forward and backward with respect to each other.

Although the thickness T of the retainer position inspection piece 322 is substantially the same as the depth D of the second groove 315 to align the inner surface of the retainer position inspection piece 322 with the inner surface of the wall 313 in the second embodiment, the present invention is not limited to this structure. For example, the second groove 315 may be formed as a stepped groove and a shallower groove may bring the inner surface of the fitting inspection piece 322 into alignment with the surface of the wall 313. Alternatively, the depth D of the second groove 315 may be greater than the thickness T of the retainer position inspection piece 322 and protrusions formed on the bottom of the groove 315 may be provided to raise the retainer position inspection piece 322 from the bottom so that the inner surface of the retainer position inspection piece 322 is flush with the inner surface of the wall 313.

From the above description of the invention, those skilled in the art will perceive improvements, changes and modifications. Such improvements, changes and modifications within the skill of the art are intended to be covered by the appended claims.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

The present disclosure relates to subject matter contained in Japanese Patent Application No. 2001-172104 filed on Jun. 7, 2001, and Japanese Patent Application No. 2001-181160 filed on Jun. 15, 2001, the disclosures of which are herein expressly incorporated by reference in their entireties.

What is claimed is:

1. An apparatus for inspecting a connector including a connector housing having a terminal receiving portion with cavities in which terminals are insertable, and a retainer attached to the terminal receiving portion for preventing removal of the terminals from the cavities, wherein an outer portion of the retainer protrudes from a surface of a retainer attachment wall when the retainer is not in a properly locked position for preventing terminal removal, and wherein the outer portion of the retainer does not protrude from the surface of the retainer attachment wall when the retainer is in a properly locked position for preventing terminal removal, said apparatus comprising:

a holder for holding the connector during inspection;

an inspection unit movable toward and away from said holder; and a movement device that moves said inspection unit toward and away from said holder;

said inspection unit including a retainer position inspection piece which passes over a portion of the surface of the retainer attachment wall when said inspection unit is moved toward said holder by said movement device, said retainer position inspection piece being movable forwardly and rearwardly relative to said inspection unit within a predetermined range;

wherein a distal end of said retainer position inspection piece passes over the outer portion of the retainer during movement of said inspection unit toward said holder when the retainer is in the properly locked position, and said retainer position inspection piece remains in a forwardly movable condition relative to said inspection unit;

wherein the distal end of said retainer position inspection piece engages the outer portion of the retainer protruding from the surface of the retainer attachment wall during movement of said inspection unit toward said holder when said retainer is not in the properly locked position, and said retainer position inspection piece is placed in a rearwardly movable condition relative to said inspection unit.

2. An apparatus for inspecting a connector according to claim 1, wherein said inspection unit further includes a biasing member that biases said retainer position inspection piece relative to said inspection unit for the relative forward and rearward movement within the predetermined range.

3. An apparatus for inspecting a connector according to claim 2, wherein said biasing member includes a coil spring.

4. An apparatus for inspecting a connector according to claim 1, wherein said inspection unit further includes a continuity test pin configured to contact a terminal within the connector when said inspection unit is moved toward said holder by said movement device, said contact taking place regardless of whether said retainer position inspection piece is in the forwardly movable condition or the rearwardly movable condition.

5. An apparatus for inspecting a connector according to claim 1, wherein said inspection unit further includes an electrical detection device that generates electrical signals in response to the forwardly movable condition of said retainer position inspection piece and the rearwardly movable condition of said retainer position inspection piece.

6. An apparatus for inspecting a connector according to claim 5, wherein the connector has a hood surrounding at least the terminal receiving portion with a given clearance;

wherein said electrical detection device includes a conductive detection piece parallel to and movable with said retainer position inspection piece;

wherein said holder includes a pit for holding said connector with said retainer oriented in a lateral position, a conductive detection recess for receiving said conductive detection piece, and a biasing member that pushes said conductive detection piece received in said conductive detection recess toward said pit; and wherein a predetermined distance from said conductive detection piece to a surface of said retainer position inspection piece opposed to the retainer attachment wall is such that said retainer position inspection piece slides on the surface of the retainer attachment wall.

7. An apparatus for inspecting a connector including a connector housing having a terminal receiving portion with cavities in which terminals are insertable, and a retainer attached to the terminal receiving portion for preventing removal of the terminals from the cavities, wherein an outer portion of the retainer protrudes from a surface of a retainer attachment wall when the retainer is not in a properly locked position for preventing terminal removal, and wherein the outer portion of the retainer does not protrude from the surface of the retainer attachment wall when the retainer is in a properly locked position for preventing terminal removal, said apparatus comprising:

a holder for holding the connector during inspection;

an inspection unit movable toward and away from said holder;

a movement device that moves said inspection unit toward and away from said holder;

said inspection unit including a retainer position inspection piece which passes over a portion of the surface of the retainer attachment wall when said inspection unit is moved toward said holder by said movement device; and said holder including a biasing member that biases one of the connector toward the retainer position inspection piece, and the retainer position inspection piece toward the connector, so that the retainer position inspection piece is positioned adjacent to the surface of the retainer attachment wall when said inspection unit is moved toward said holder by said movement device;

wherein a distal end of said retainer position inspection piece passes over the outer portion of the retainer during movement of said inspection unit toward said holder when the retainer is in the properly locked position, and the distal end of said retainer position inspection piece engages the outer portion of the retainer protruding from the surface of the retainer attachment wall during movement of said inspection unit toward said holder when said retainer is not in the properly locked position.

8. An apparatus for inspecting a connector according to claim 7, wherein said inspection unit further includes a continuity test pin configured to contact a terminal within the connector when said inspection unit is moved toward said holder by said movement device.

9. An apparatus for inspecting a connector according to claim 7, wherein said biasing member includes at least one pushing device that pushes the connector toward the retainer position inspection piece.

10. An apparatus for inspecting a connector according to claim 9, wherein said holder further includes a recess for holding the connector, said recess including first and second walls, said first wall including a groove in which the retainer position inspection piece slides, and said second wall including at least one opening in which said at least one pushing device is mounted for pushing the connector toward said first wall.

11. An apparatus for inspecting a connector according to claim 10, wherein said second wall includes two said openings in which two said pushing devices are mounted for pushing the connector toward said first wall.

12. An apparatus for inspecting a connector according to claim 7, wherein said biasing member includes a pushing device that pushes the retainer position inspection piece toward the connector.

13. An apparatus for inspecting a connector according to claim 12, wherein pushing device includes a coil spring and a ball.

14. An apparatus for inspecting a connector according to claim 12, wherein the connector has a hood surrounding at least the terminal receiving portion with a given clearance;

wherein said inspection unit further includes an electrical detection device that determines whether the retainer is in the properly locked position;

wherein said electrical detection device includes a conductive detection piece parallel to and movable with said retainer position inspection piece;

wherein said holder includes a pit for holding said connector with said retainer oriented in a lateral position, and a conductive detection recess for receiving said conductive detection piece;

wherein said pushing device pushes said conductive detection piece received in said conductive detection recess toward said pit; and wherein a predetermined distance from said conductive detection piece to a surface of said retainer position inspection piece opposed to the retainer attachment wall is such that said retainer position inspection piece slides on the surface of the retainer attachment wall.

* * * * *

UNITED STATES PATENT AND TRADEMARK OFFICE
CERTIFICATE OF CORRECTION

PATENT NO.    : 6,731,118 B2
DATED         : May 4, 2004
INVENTOR(S)   : A. Nishino et al.

It is certified that error appears in the above-identified patent and that said Letters Patent is hereby corrected as shown below:

<u>Title page,</u>
Item [56], References Cited, FOREIGN PATENT DOCUMENTS,
"112333186" should read -- 11233186 --.

Signed and Sealed this

Twenty-fifth Day of January, 2005

JON W. DUDAS
*Director of the United States Patent and Trademark Office*